United States Patent
Yao et al.

(10) Patent No.: US 8,709,875 B2
(45) Date of Patent: Apr. 29, 2014

(54) POWER DEVICE AND METHOD OF PACKAGING SAME

(75) Inventors: Jinzhong Yao, Tianjin (CN); Zhigang Bai, Tianjin (CN); Xuesong Xu, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 114 days.

(21) Appl. No.: 13/549,518

(22) Filed: Jul. 16, 2012

(65) Prior Publication Data

US 2013/0049183 A1 Feb. 28, 2013

(30) Foreign Application Priority Data

Aug. 31, 2011 (CN) .......................... 2011 1 0253157

(51) Int. Cl.
*H01L 21/48* (2006.01)

(52) U.S. Cl.
USPC ................... 438/123; 257/676; 257/E21.499; 257/E23.037; 257/E23.039

(58) Field of Classification Search
CPC .................... H01L 23/49575; H01L 21/4821; H01L 23/49811; H01L 21/568

USPC ................. 438/112, 113, 123, 119; 257/676, 257/E23.039, E23.037, E21.502, E21.513, 257/E21.499

See application file for complete search history.

(56) References Cited

U.S. PATENT DOCUMENTS

| | | | |
|---|---|---|---|
| 6,215,176 B1 | 4/2001 | Huang | |
| 6,420,779 B1 * | 7/2002 | Sharma et al. | ............... 257/666 |
| 6,917,097 B2 | 7/2005 | Chow et al. | |
| 2007/0278632 A1 | 12/2007 | Zhao et al. | |

* cited by examiner

*Primary Examiner* — David Vu
(74) *Attorney, Agent, or Firm* — Charles Bergere

(57) ABSTRACT

A method of packaging a power semiconductor die includes providing a first lead frame of a dual gauge lead frame. The first lead frame includes a thick die pad. A tape is attached to a first side of the thick die pad and the power die is attached to a second side of the thick die pad. A second lead frame of the dual gauge lead frame is provided. The second lead frame has thin lead fingers. One end of the lead fingers is attached to an active surface of the power die such that the lead fingers are electrically connected to bonding pads of the power die. A molding compound is then dispensed onto a top surface of the dual gauge lead frame such that the molding compound covers the power die and the lead fingers.

13 Claims, 5 Drawing Sheets

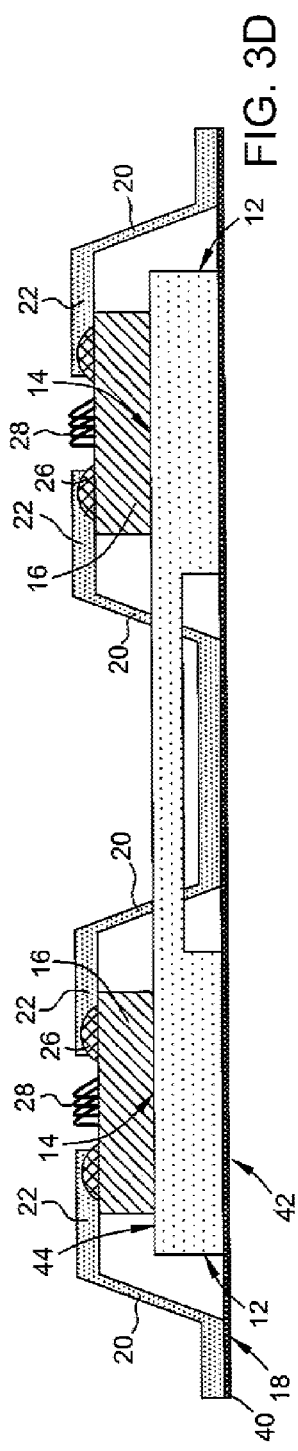
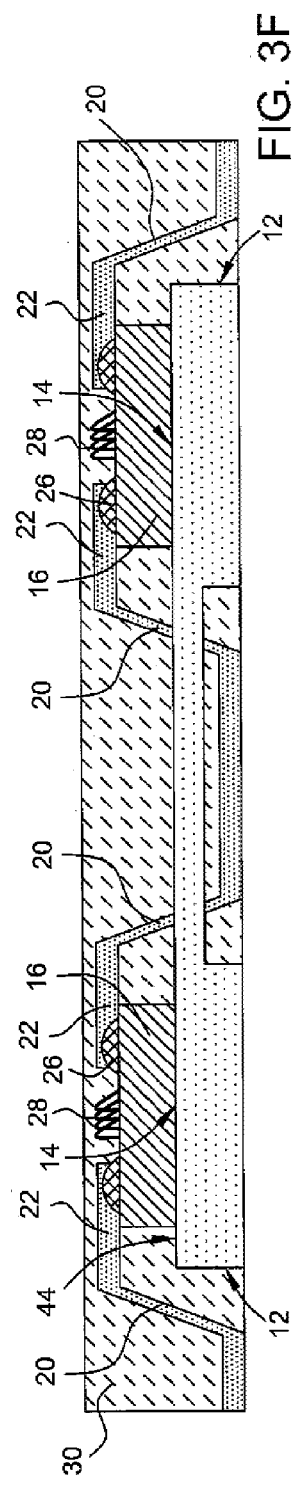
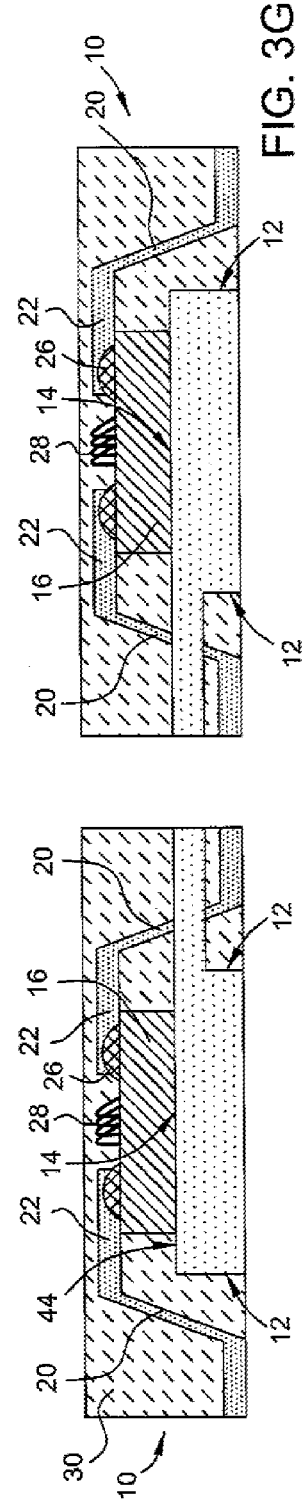

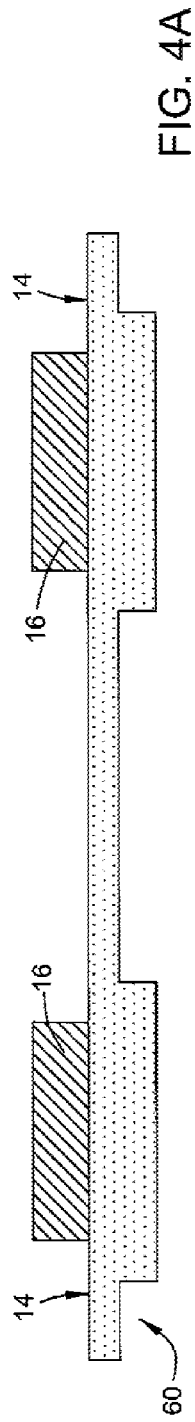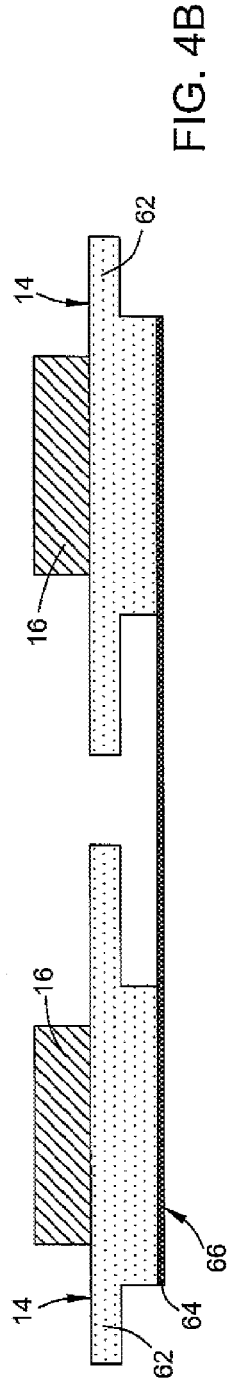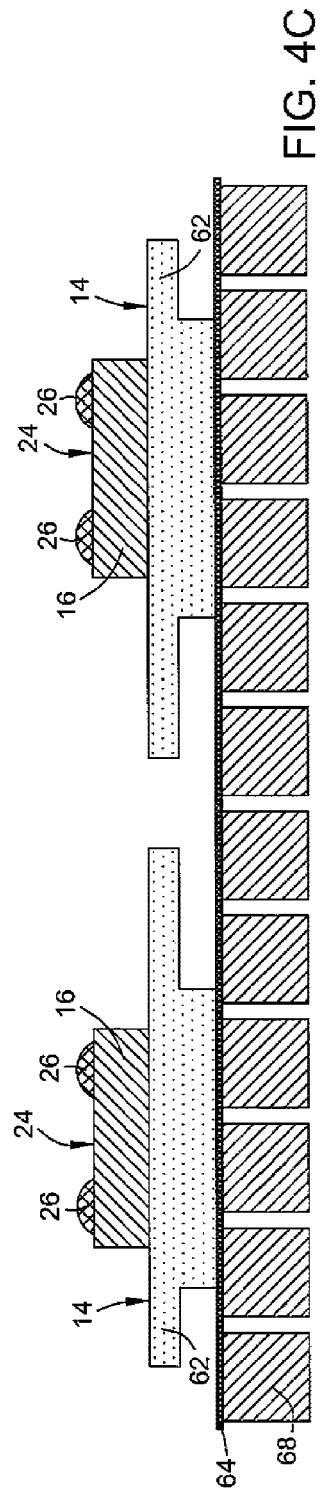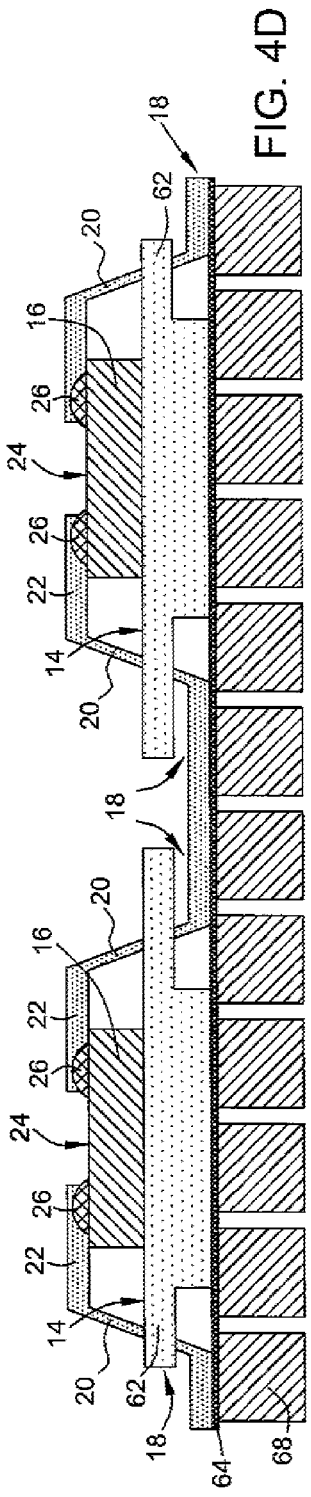

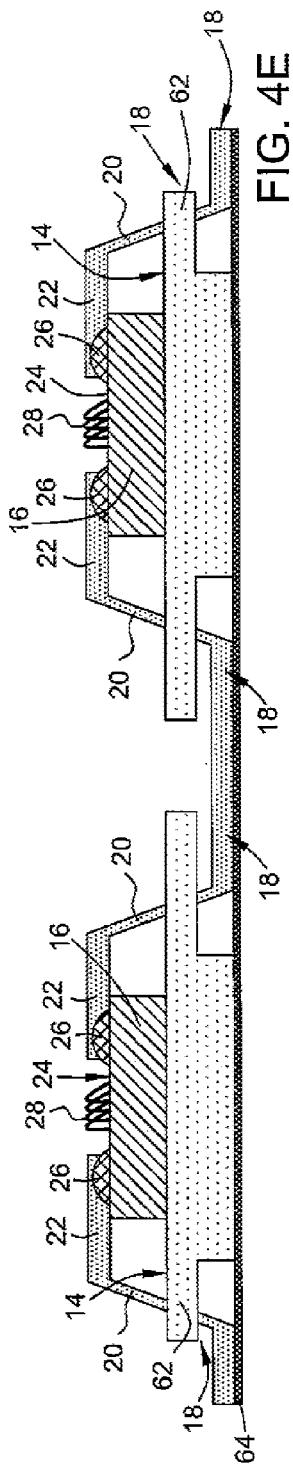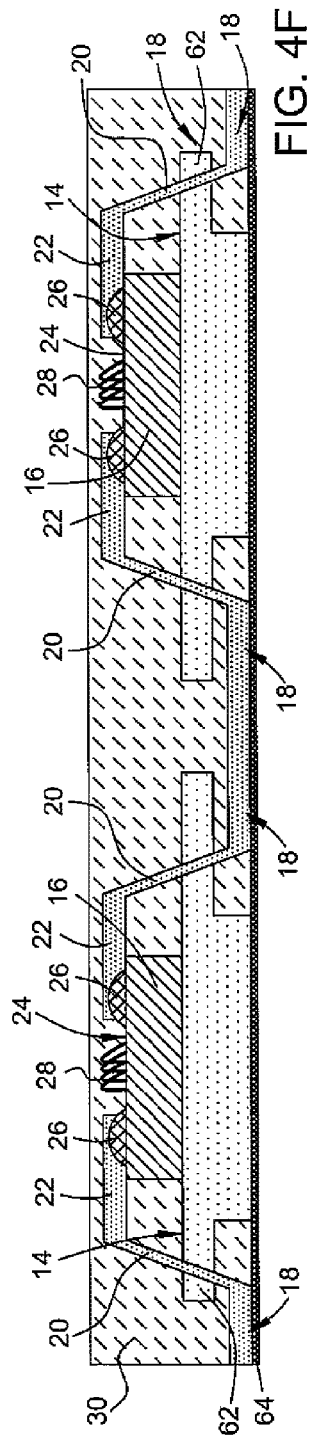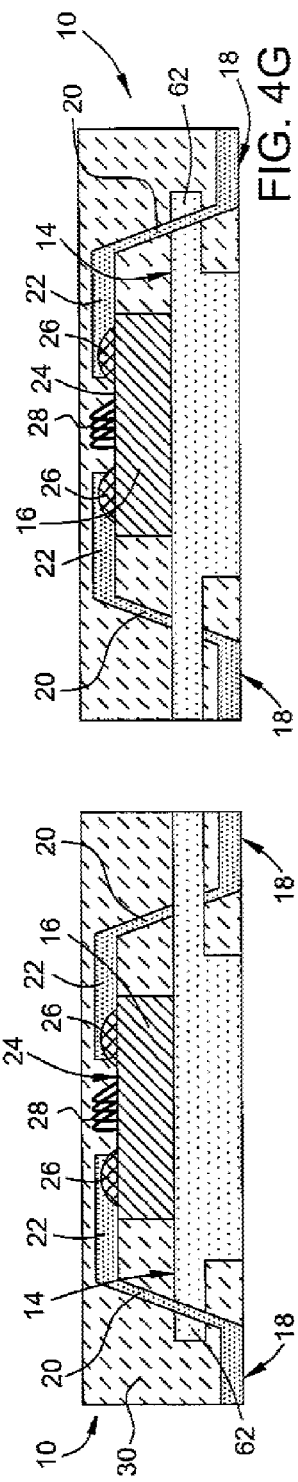

POWER DEVICE AND METHOD OF PACKAGING SAME

BACKGROUND OF THE INVENTION

The present invention relates generally to packaging of power semiconductor devices, and more particularly to a method of assembling quad flat no-lead (QFN) power semiconductor packages.

High voltage and power semiconductor devices such as switching circuits and power MOSFET devices are with a variety of electronic devices. Typically, such circuits must be able to handle high currents and high power dissipation.

One way of packaging a power semiconductor die is to mount the die on a thick lead frame, electrically connect the die to the leads of the lead frame with a heavy gauge wire, and encapsulate the die and lead frame assembly with a molding compound. Thus, the thick lead frame must be able to accommodate the heavy gauge wire. Some such packages use soldered copper clips, but a special bonding tool is required to handle the clips.

Heavy gauge wires, copper clips and thick lead frames also are relatively expensive, increasing the overall packaging costs. Accordingly, it would be advantageous to be able to package power devices with less expensive materials yet provide improved thermal performance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

FIG. 3D illustrates a step of electrically connecting some of the lead fingers of the second lead frame to bonding pads of the power semiconductor dies;

FIG. 3F illustrates a step of dispensing a molding compound onto a top surface of the dual gauge lead frame assembly of FIG. 3E;

FIG. 3G illustrates individual packaged semiconductor devices after being separated from each other by a singulation process;

FIG. 4A is a side cross-sectional view showing a power lead frame with a plurality of die pads and power semiconductor dies attached to the die pads;

FIG. 4B illustrates a step of singulating the power lead frame to form individual power lead frames;

FIG. 4C illustrates a step of dispensing an adhesive on the top surface of each of the power semiconductor dies;

FIG. 4D illustrates a step of attaching and electrically connecting input-output lead frames to the power semiconductor dies;

FIG. 4E illustrates a step of electrically connecting the lead fingers of the input-output lead frames as well as bonding pads of the power semiconductor dies to bond pads of another die (not shown) with bond wires;

FIG. 4F illustrates a step of dispensing a molding compound onto a top surfaces of the power lead frame assemblies of FIG. 4E; and FIG. 4G illustrates individual packaged semiconductor devices after being separated from each other by a singulation process.

DETAILED DESCRIPTION OF THE INVENTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a method of packaging an integrated circuit. The method includes providing a first lead frame of a dual gauge lead frame. The first lead frame includes a thick die pad. A tape is attached to a first side of the thick die pad and a semiconductor die is attached to a second side of the thick die pad. A second lead frame of the dual gauge lead frame that includes a plurality of thin lead fingers is provided. One end of the lead fingers is attached to an active surface of the power semiconductor die and the lead fingers are electrically connected to bonding pads of the semiconductor die. A molding compound is then dispensed or transferred onto a top surface of the dual gauge lead frame and the die such that the molding compound covers the semiconductor die and the lead fingers.

In another embodiment, the present invention is a power device packaged in accordance with the above-described method.

Figure 1:
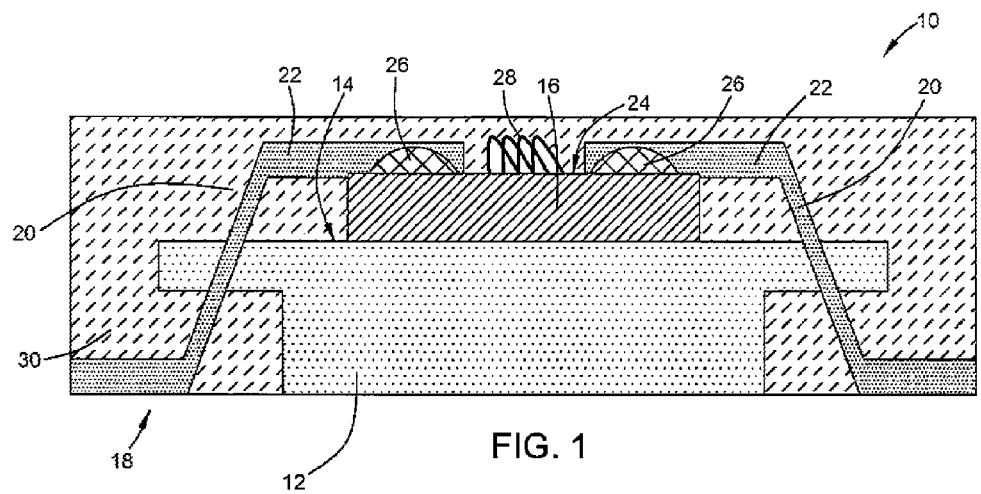
FIG. 1 is an enlarged, side cross-sectional view of a packaged power semiconductor device in accordance with one embodiment of the present invention.

Referring now to FIG. 1, a cross-sectional view of a packaged power semiconductor device 10 in accordance with an embodiment of the present invention is shown. The device 10 includes a first, power lead frame 12 including a die pad 14. The power lead frame 12 may be formed of a metal or a metal alloy. In certain exemplary embodiments, the power lead frame 12 may be formed of copper, copper alloys, iron, aluminium, aluminium alloys, steel or other appropriate materials.

A power semiconductor die 16 is attached to the power lead frame 12. The power semiconductor die 16 may include control circuits, power metal oxide semiconductor field effect transistors (MOSFETs), insulated gate bipolar transistors (IGBTs), junction gate field effect transistors (JFETs), and other types of circuits that are known to produce heat and relatively high currents. The power semiconductor die 16 may be attached to the die pad 14 of the power frame 12 using a die attach adhesive or solder, as is known in the art.

The device 10 also includes a second lead frame 18 having lead fingers 20. In this exemplary embodiment of the invention, the lead fingers 20 are bent to form a Z-shape. As illustrated, one end 22 of each of the lead fingers 20 is attached to an active surface 24 of the power semiconductor die 16 using an electrically conductive material such as a conductive adhesive 26. More specifically, the ends 22 of the lead fingers 20 are in contact with pads of the die 16 that are located on the active surface 24 of the die 16. The power lead frame 12 and the second lead frame 18 together comprise a dual gauge lead frame. In this exemplary embodiment of the invention, a thickness of the power lead frame 12 is substantially greater than a thickness of the second lead frame 18. In one exemplary embodiment, the thickness of the power lead frame 12 is about 30 mils and the thickness of the second lead frame 18 is about 10 mils.

It should be noted that the thickness of the power lead frame 12 enhances the thermal performance of the power device 10, while the second, thinner lead frame 18 with thin lead fingers 20 reduces the overall manufacturing cost of the device 10.

Figure 2:
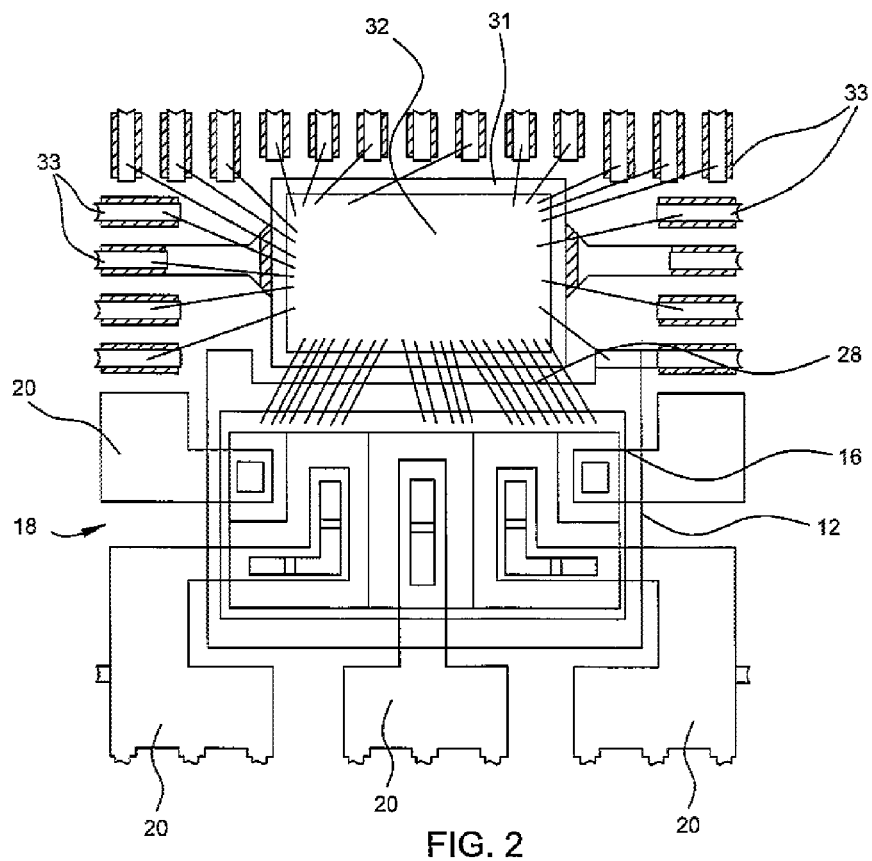
FIG. 2 is an enlarged top view of the packaged power semiconductor device of FIG. 1 prior to being fully assembled.

Referring now to both FIGS. 1 and 2, in one embodiment of the present invention, the device 10 includes a second die 32 (FIG. 2) that is disposed adjacent to the power semiconductor die 16. The second die 32 is attached to a die pad 31 of the second lead frame 18. The second die 32 may be any type of integrated circuit, such as a controller, microprocessor, or custom logic circuit. The second die 32 is electrically coupled to the power semiconductor die 16 and lead fingers 33 with bond wires 28. The bond wires 28 are bonded to die pads on the active surface of the power semiconductor die 16 and to bonding pads on the active surface of the second die 32 using a well known wire bonding process and known wire bonding equipment. Further, as shown in FIG. 2 and mentioned above, some of the die pads on the active surface of the second die 32 also are electrically connected to lead fingers 33. The lead fingers 33 may be small lead fingers of the second lead frame 18. Alternatively, a third lead frame could be provided that includes a die pad 31 for the second die 32 and small lead fingers 33. The bond wires 28 are formed from a conductive material such as aluminium, copper or gold.

A molding compound 30 is disposed on a top surface of the power lead frame 12, the second lead frame 18, the power semiconductor die 16, the second die 32, and the bond wires 28. The molding compound 30 may include plastic or an epoxy molding compound, as is known in the art. The example configuration of the packaged semiconductor power device of FIG. 1 is a flat no-lead package (DFN or QFN).

Figure 3A:
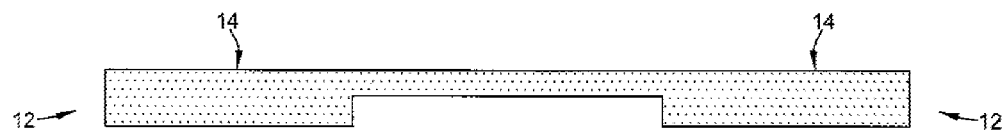
FIG. 3A is a side cross-sectional view showing a first lead frame of a dual gauge lead frame.

FIGS. 3A-3F illustrate various steps for packaging a power device in accordance with an embodiment of the present invention. Like elements have like numbers with FIGS. 1 and 2. FIG. 3A is a side cross-sectional view showing the first lead frame 12 of the dual gauge lead frame. The first lead frame 12 includes one or more thick die pads 14. The first lead frame 12 may be formed of a metal or a metal alloy. In this exemplary embodiment, the thickness of the die pad 14 is about 30 mils. In the illustrated embodiment of the invention, the first lead frame 12 has two die pads 14. However, it is to be understood that the lead frame 12 may be formed with an array or panel of lead frames with thick die pads such that multiple devices may be assembled simultaneously.

Figure 3B:
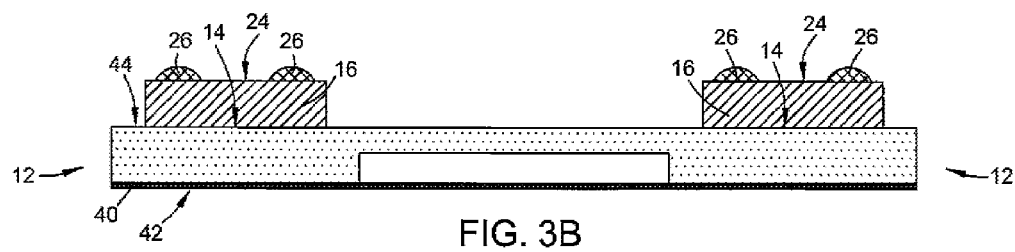
FIG. 3B is an illustration of a step of attaching a tape and power semiconductor dies to the first lead frame.

FIG. 3B is an illustration of a step of attaching an adhesive tape 40 and power semiconductor dies 16 to the first lead frame 12. The tape 40 is attached to a first side 42 of the thick die pad 14 of the first lead frame 12 and the semiconductor dies 16 are attached to a second side 44 of the respective thick die pads 14. The semiconductor dies 16 are attached to the respective die pads 14 with a die attach adhesive (not shown) such as die-bonding epoxy. The die attach adhesive is dispensed on the second side of the die pads 14 using a known dispensing device and the semiconductor dies 16 are placed on the die attach adhesive to attach the dies 16 to the respective die pads 14.

Figure 3C:
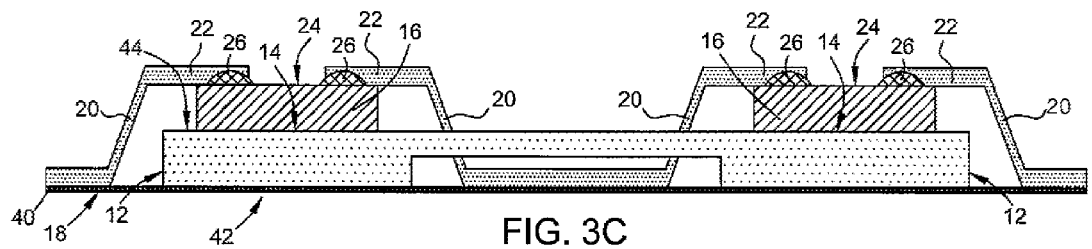
FIG. 3C is an illustration of a step of attaching a second lead frame of the dual gauge lead frame to the semiconductor dies.

An adhesive 26 is dispensed onto the active surface 24 and more particularly onto selected ones of the die pads on the active surface 24 of each of the semiconductor dies 16 using a known dispensing device. The adhesive 26 is preferably formed of a conductive material, like solder, but may include a polymer material. Other conductive adhesive materials also may be utilized. FIG. 3C is an illustration of a step of attaching and electrically connecting the second lead frame 18 to each of the semiconductor dies 16. The second lead frame 18 includes the lead fingers 20 and lead fingers 33 (not shown). In this exemplary embodiment, the lead fingers 20 are bent to form a Z-shape. However, the lead fingers 20 may have other similar shapes that conform to the height difference between die surface 24 and the first lead frame 12.

It should be noted that a thickness of the die pads 14 is substantially greater than a thickness of the lead fingers 20. In one exemplary embodiment, the thickness of the die pads 14 is about 30 mils and the thickness of the lead fingers 20 is about 10 mils. As illustrated, one end 22 of each of the lead fingers 20 is attached and electrically connected to pads on the active surface 24 of the respective semiconductor dies 16 with the adhesive 26. An oven curing step may be performed in order to cure the die attach adhesive and the adhesive 26 for attaching the lead fingers 20 to the semiconductor dies 16.

Figure 3E:
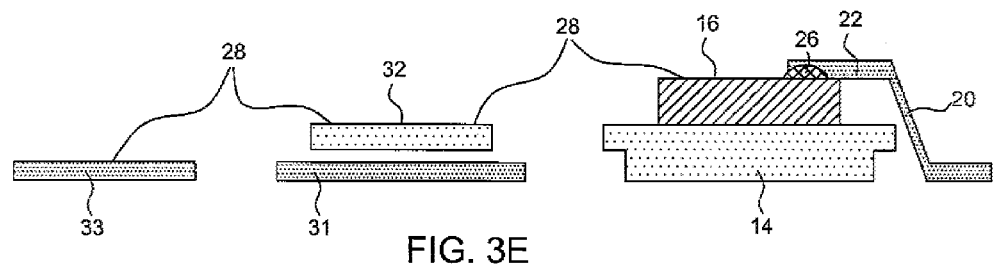
FIG. 3E is a view perpendicular to FIG. 3D and illustrates a step of electrically connecting some of the lead fingers of the second lead frame to bonding pads of second dies and also connecting die bonding pads of the power dies with respective die bonding pads of the second dies.

FIGS. 3D and 3E show the wire bonding steps of the present invention. Wire bonding is used to electrically connect some of the die bonding pads of the power die 16 to some of the die bonding pads of the second die 32; and also to electrically connect other ones of the die bonding pads of the second die 32 to small lead fingers 33 of the second lead frame 18. Thus, in this embodiment of the present invention, lead fingers 20 are provided and directly attached and electrically connected to some of the die pads of the power semiconductor die 16 while other, small lead fingers 33 are electrically connected to other ones of the die pads of the second die 32 using bond wires 28. Bond wires 28 also are used to connect some of the die bonding pads of the first die 16 with some of the die bonding pads of the second die 32. In this way, the lead fingers 20 connected to the power die 16 allow a large electrical current load capacity while the bond wire 28 allows design flexibility for the second die 32 for which much smaller current load is required but more connections are needed for control signals.

FIG. 3F shows the step of disposing a molding compound 30 onto a top surface of the dual gauge lead frame assembly. The molding compound 30 covers the lead frames 12, 18, semiconductor dies 16, 32, the lead fingers 20 and the wires 28. As used herein, the term "disposing" refers to dispensing or transferring the molding compound 30 onto the dual gauge lead frame assembly using known methods such as with a nozzle of a conventional dispensing machine or in mold chase and via injection molding, as is known in the art. Alternative known materials that may be used for the molding compound include a silica-filled resin, a ceramic, a halide-free material, the like, or combinations of the above. The molding compound is typically applied in liquid form and then cured until transformed to a solid form.

After the molding compound 30 is deposited or applied, the tape 40 is removed and each device portion is singulated one from another. In the illustrated embodiment, portions of the lead fingers 20 are exposed after removing the tape 40.

FIG. 3G shows the individual packaged semiconductor devices 10 after being separated from each other by a singulation process. Singulation processes are well known and may include cutting with a saw or a laser.

FIGS. 4A-4G illustrate various steps for packaging a power device in accordance with another embodiment of the invention. FIG. 4A is a side cross-sectional view showing a power lead frame 60 that includes a plurality of die pads 14 (two of which are shown). Semiconductor dies 16 are attached to respective ones of the die pads 14 with a die attach adhesive such as die-bonding epoxy.

FIG. 4B shows the step of singulating the power lead frame 60 to form individual power lead frame assemblies represented by reference numeral 62. The individual power lead frame assemblies 62 may be separated using a saw or laser. Each of the individual power lead frame assemblies 62 includes at least one die pad 14 and a die 16 attached thereto. A tape 64 is attached to a first side 66 of the power lead frame assemblies 62.

FIG. 4C shows the step of dispensing the adhesive 26 on the top surface 24 of each of the semiconductor dies 16. More particularly, the adhesive 26 is dispensed over the I/O pads of the dies 16 on the active surfaces of the dies 16. In the illustrated embodiment, the individual power lead frame assemblies 62 are placed on a vacuum chuck table 68, which firmly holds the assemblies 62 and then the adhesive 26 is dispensed onto the semiconductor dies 16.

FIG. 4D shows the step of attaching second lead frames 18 to the semiconductor dies 16. Again, the thickness of the individual power lead frames 62 is substantially greater than the thickness of the input-output lead frames 18. As illustrated, one end 22 of each the lead fingers 20 of the lead frames 18 is attached to a pad on the active surface 24 of the respective semiconductor die 16 with the adhesive 26. The adhesive 26 is subsequently cured in an oven. By connecting the lead fingers 20 directly the die I/O pads with the adhesive 26, the need for expensive copper clips and the like is avoided.

FIG. 4E shows the step of electrically connecting the lead fingers 20 to bonding pads of the respective semiconductor dies 16 with bond wires 28. In another embodiment, the bonding pads of the respective semiconductor dies 16 are electrically connected to a second die (not shown) on the second lead frame with the bond wires 28 using a well known wire bonding process and known wire bonding equipment.

FIG. 4F shows the step of disposing a molding compound 30 onto a top surface of the individual power lead frame assemblies 62. The molding compound 30 covers the semiconductor dies 16, the individual power lead frames 12, lead fingers 20, and wires 28 (if any). After the molding compound 30 is deposited or applied, the tape 64 is removed and the power lead frame assemblies 12 are separated from each other (singulation step), and then trimmed to form the individual packaged semiconductor devices 10 as shown in FIG. 4G.

The technique described above may be employed for power quad flat-noleads (PQFN) packages, heat slug outline packages (HSOPs) and power quad flat packages (PQFPs).

A dual gauge lead frame having a first lead frame with a thick die pad and a second lead frame with thin lead fingers is employed for packaging the power device. A power semiconductor die is attached to the thick die pad of the first lead frame. Further, the lead fingers of the second lead frame are attached and electrically coupled to the power semiconductor die. The direct connection of the second lead frame with the semiconductor die avoids the need of an additional process for interconnects. Subsequently, a molding compound is utilized to cover the power semiconductor die and the lead fingers.

Thus, the present invention provides a method of packaging power semiconductor dies without requiring use of heavy gauge aluminium wire bonding or soldered copper clip interconnects thereby improving manufacturability and product performance of such devices. Moreover, the packaging technique described above provides a better high power reliability assessment (HPRA) performance, prevents wire bond pad contamination and low strip warpage while substantially reducing the overall costs of such packages.

Thus, the present invention provides a method of packaging power semiconductor dies without requiring use of heavy gauge aluminium wire bonding or soldered copper clip interconnects thereby improving manufacturability and product performance of such devices. Moreover, the packaging technique described above provides a better high power reliability assessment (HPRA) performance, prevents wire bond pad contamination and low strip warpage while substantially reducing the overall costs of such packages.

Circuit details are not disclosed because knowledge thereof is not required for a complete understanding of the invention. Although the invention has been described using relative terms such as "front," "back," "top," "bottom," "over," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A method of packaging an integrated circuit, comprising the steps of:

providing a first lead frame of a dual gauge lead frame, the first lead frame comprising a thick die pad;
attaching a tape to a first side of the thick die pad;
attaching a power semiconductor die to a second side of the thick die pad;
providing a second lead frame of the dual gauge lead frame, the second lead frame comprising a plurality of thin lead fingers;
directly attaching first ends of the lead fingers to bonding pads on an active surface of the power semiconductor die such that the lead fingers are in contact with and electrically connected to the bonding pads; and
dispensing a molding compound onto a top surface of the dual gauge lead frame such that the molding compound covers the power semiconductor die and the lead fingers.

2. The method of packaging an integrated circuit of claim 1, further comprising electrically connecting additional bonding pads of the power semiconductor die to bonding pads of a second die with bond wires.

3. The method of packaging an integrated circuit of claim 2, further comprising electrically connecting additional bonding pads of the second die to additional lead fingers of the second lead frame.

4. The method of packaging an integrated circuit of claim 1, further comprising removing the tape from the die pad, wherein second ends of the lead fingers are exposed after removing the tape.

5. The method of packaging an integrated circuit of claim 1, wherein a thickness of the die pad is substantially greater than a thickness of the lead fingers.

6. The method of packaging an integrated circuit of claim 5, wherein the thickness of the die pad is about 30 mils and the thickness of the lead fingers is about 10 mils.

7. The method of packaging an integrated circuit of claim 1, wherein attaching the first ends of the lead fingers to the die comprises attaching the lead fingers to the die with a conductive adhesive.

8. The method of packaging an integrated circuit of claim 7, wherein the conductive adhesive comprises one of a polymer and solder.

9. The method of packaging an integrated circuit of claim 1, wherein the lead fingers are bent to form a Z-shape.

10. A method of packaging a power semiconductor device, comprising the steps of:
providing a power frame having a plurality of die pads;
attaching power semiconductor dies to respective die pads of the power frame;
singulating the power frame to form individual power frame assemblies, each power frame assembly having at least one die mounted on at least one die pad;
attaching a tape to a first side of the individual power frame assemblies;
attaching input-output lead frames having lead fingers to an active surface of each of the power semiconductor dies, wherein said attaching also electrically connects the input-output lead frames to respective power semiconductor dies, and wherein a thickness of the input-output lead frame is less than a thickness of the power frame;
dispensing a molding compound onto a top surface of the power frame assemblies such that the molding compound covers the power semiconductor dies, the power frames and the lead fingers; and
singulating the input-output lead frames to form individual power semiconductor device packages.

11. The method of packaging a power semiconductor device of claim 10, wherein attaching the input-output lead frame comprises attaching one end of the leads of the input-output lead frame to respective die pads of the respective power semiconductor dies with a conductive adhesive and curing the adhesive.

12. The method of packaging a power semiconductor device of claim 11, further comprising removing the tape after the molding compound dispensing step.

13. The method of packaging a power semiconductor device of claim 11, further comprising the steps of:
attaching a control die to a die pad of the input-output lead frame;
electrically connecting some of the die bonding pads of the power semiconductors to die bonding pads of the control die with bond wires; and
connecting some of the die bonding pads of the control die to small leads of the input-output lead frame with wires.

\* \* \* \* \*